(12) United States Patent
Furui et al.

(10) Patent No.: US 7,572,350 B2
(45) Date of Patent: *Aug. 11, 2009

(54) METHOD OF CUTTING LAMINATE, APPARATUS FOR MANUFACTURING LAMINATE, METHOD OF MANUFACTURING LAMINATE, AND LAMINATE

(75) Inventors: Toshikazu Furui, Kawasaki (JP); Naohisa Matsushita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/245,048

(22) Filed: Oct. 7, 2005

(65) Prior Publication Data
US 2006/0076105 A1    Apr. 13, 2006

Related U.S. Application Data

(63) Continuation-in-part of application No. 10/968,139, filed on Oct. 20, 2004, now Pat. No. 7,491,288.

(30) Foreign Application Priority Data

Jun. 7, 2004    (JP)    ............... 2004-168312
Jun. 7, 2005    (JP)    ............... 2005-167235

(51) Int. Cl.
| | |
|---|---|
| B29C 65/16 | (2006.01) |
| B32B 37/18 | (2006.01) |
| B32B 38/04 | (2006.01) |
| B26D 3/08 | (2006.01) |
| B31B 1/25 | (2006.01) |
| H01L 21/301 | (2006.01) |
| B32B 38/18 | (2006.01) |
| B26D 3/10 | (2006.01) |
| H01L 21/304 | (2006.01) |
| B26D 7/10 | (2006.01) |
| B26D 1/56 | (2006.01) |

(52) U.S. Cl. .............. 156/272.8; 156/250; 83/16; 83/29; 83/33; 83/875; 83/879; 83/880; 438/113; 438/458; 438/460; 438/462

(58) Field of Classification Search ......... 156/250, 156/272.8; 83/13–56, 875–887; 438/460–465
See application file for complete search history.

(56) References Cited

U.S. PATENT DOCUMENTS 5,251,142 A    10/1993    Cramer (Continued)

FOREIGN PATENT DOCUMENTS

JP    11-195624    7/1999

(Continued)

OTHER PUBLICATIONS

German Office Action dated Oct. 27, 2005 of Application No. 10 2004 055 040.9-34.

(Continued)

Primary Examiner—Philip C Tucker
Assistant Examiner—Sonya Mazumdar
(74) Attorney, Agent, or Firm—Staas & Halsey LLP

(57) ABSTRACT

A device such as an MEMS device is fabricated by cutting a laminate of a semiconductor substrate and a glass substrate. Grooves are formed in the glass substrate, and the semiconductor substrate and the glass substrate are laminated together such that the groove faces the semiconductor substrate. The laminated substrates are irradiated with a laser along the groove from the side of the glass substrate. In this way, the laminate is cut into elements.

10 Claims, 7 Drawing Sheets

U.S. PATENT DOCUMENTS

| | | | |
|---|---|---|---|
| 5,963,289 A * | 10/1999 | Stefanov et al. | 349/187 |
| 6,271,102 B1 * | 8/2001 | Brouillette et al. | 438/462 |
| 6,472,295 B1 * | 10/2002 | Morris et al. | 438/463 |
| 6,476,415 B1 * | 11/2002 | Walker et al. | 257/59 |
| 6,671,940 B2 | 1/2004 | Ishii | |
| 7,129,114 B2 * | 10/2006 | Akram | 438/110 |
| 7,405,376 B2 * | 7/2008 | Kobayashi et al. | 219/121.68 |
| 2001/0041387 A1 | 11/2001 | Tateiwa et al. | |
| 2003/0006221 A1 | 1/2003 | Hong et al. | |
| 2003/0145624 A1 * | 8/2003 | Luettgens et al. | 65/17.1 |
| 2004/0002199 A1 * | 1/2004 | Fukuyo et al. | 438/460 |
| 2005/0202596 A1 * | 9/2005 | Fukuyo et al. | 438/113 |
| 2006/0150788 A1 * | 7/2006 | Kim | 83/13 |
| 2007/0111477 A1 * | 5/2007 | Maruyama et al. | 438/460 |
| 2007/0287266 A1 * | 12/2007 | Chung et al. | 438/460 |

FOREIGN PATENT DOCUMENTS

| | | |
|---|---|---|
| JP | 2002-331378 | 9/2002 |
| JP | 2003-37218 | 2/2003 |

OTHER PUBLICATIONS

U.S. Appl. No. 11/488,642, filed Jul. 19, 2006, Toshikazu Furui, Fujitsu Limited.

U.S. Appl. No. 11/488,823, filed Jul. 19, 2006, Toshikazu Furui, Fujitsu Limited.

U.S. Appl. No. 10/968,139, filed Oct. 20, 2004, Toshikazu Furui, Fujitsu Limited.

* cited by examiner

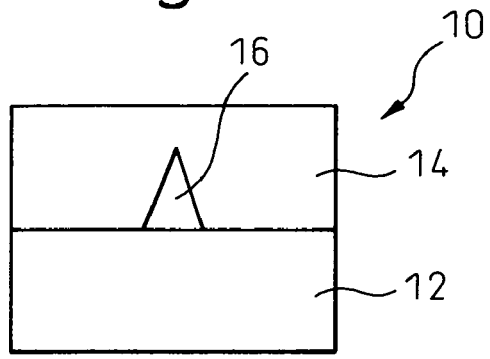
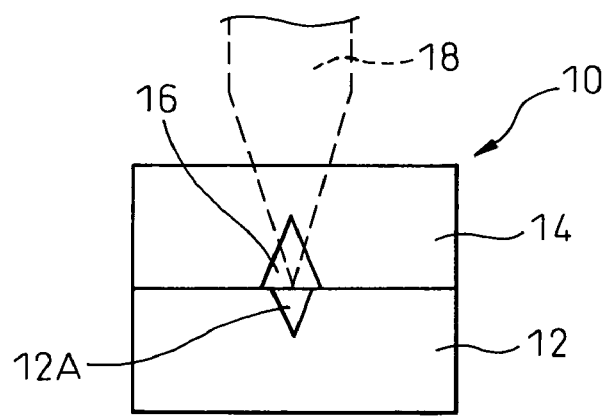
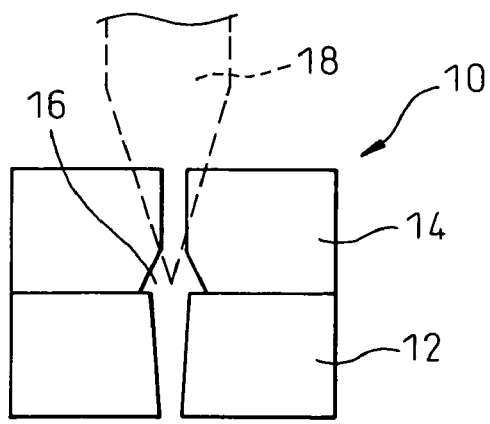

METHOD OF CUTTING LAMINATE, APPARATUS FOR MANUFACTURING LAMINATE, METHOD OF MANUFACTURING LAMINATE, AND LAMINATE

CROSS-REFERENCE TO RELATED APPLICATIONS

This application is a continuation-in-part of U.S. patent application Ser. No. 10/968,139, now U.S. Pat. No. 7,491,288, filed on Oct. 20, 2004, the contents being incorporated herein by reference.

BACKGROUND OF THE INVENTION

1. Field of the Invention

The present invention relates to a method of cutting a laminate, an apparatus for manufacturing the laminate, a method of manufacturing the laminate, and the laminate itself. In more detail, the present invention relates to a method of cutting a laminate formed of substrates of different types of laminated materials. More particularly, the present invention relates to a method of cutting a laminate formed of substrates of respective materials, the corresponding transmittance or absorptance properties of which, with respect irradiation by a laser beam, being different from each other.

2. Description of the Related Art

A device comprising a laminate including a plurality of substrates of different types of materials has recently been developed. Highly technical devices, such as micro-electronics-mechanical-system (MEMS) devices, are configured as a laminate of a substrate formed of silicon, and a substrate of lithium tantalate ($LiTaO_3$), sapphire, or heat-resistant glass, etc, superposed together. In fabricating such a device, the laminate composed of a plurality of substrates of different types of materials is cut into separate devices (chips).

In a conventional method, a semiconductor wafer is cut into separate semiconductor chips by rotating a wheel containing diamond abrasive grains at high speed. The wheel containing the diamond abrasive grains can be used also for separating the laminate of a plurality of substrates formed of different types of materials into individual devices.

In fabricating a device having a fine mechanism such as a MEMS device, however, an attempt to separate the laminate into individual devices using the wheel containing diamond abrasive grains poses the problem that the contact between the wheel and the laminate at the time of cutting operation causes the laminate to vibrate and often damages the fine mechanism of the device.

In the case where a device having a fine mechanism such as a MEMS device is fabricated, therefore, some measure is required to prevent the vibration of the laminate, and a cutting method using a laser is one choice. In the cutting method using the laser, however, the material is required to absorb the laser light, and therefore the combinations of the lasers and the materials to be cut are limited.

In the case where the laminate including a plurality of substrates of different types of material is separated into individual devices, therefore, it is necessary to use a plurality of lasers having wavelengths suitable for a plurality of materials, respectively. Japanese Unexamined Patent Publication (Kokai) No. 2003-37218, for example, discloses a method of cutting a multilayer substrate with a dual laser irradiation, in which a first laser is focused on a first substrate, and a second laser is focused on a second substrate.

In the case where the laminate including a plurality of substrates of different types of material is separated into individual devices, therefore, as many laser oscillators as there are stacked substrates are required, thereby leading to the problem of an expensive, bulky dicing apparatus.

For cutting a laminate formed of silicon having a thickness of several hundred µm and pyrex glass having a thickness of several hundred µm, such as a MEMS device recently developed, a YAG laser (laser wavelength λ of 1.064 µm) can be used as a laser capable of cutting the silicon efficiently. As a laser capable of cutting glass, on the other hand, an ultraviolet laser (laser wavelength λ of 0.35 µm) typically including the excimer laser and the THG-YAG laser or an infrared laser (laser wavelength λ of 5 µm or more) typically including the $CO_2$ laser are available. The ultraviolet laser, however, requires a long time for cutting, for example, several hours or longer to cut one line of 100 mm. The use of the infrared laser, on the other hand, results in a laser irradiation width of at least 1 mm in the cutting operation, which adversely affects internal circuits in an application to a small device.

In the case where a member, in which a silicon member and glass member are joined to each other, is cut, the following problems are encountered.

First, in the case where the silicon member side is irradiated with a laser beam so as to conduct laser beam machining, as the laser beam is absorbed by the silicon layer, it is possible to cut the silicon layer. However, the glass member transmits the laser beam. Therefore, cutting is stopped on the joining face on which the glass member and the silicon member are joined to each other.

On the other hand, in the case where the glass member side is irradiated with a laser beam, the laser beam penetrates the glass member and reaches the silicon face. In this case, as the silicon member is cut, the glass member can be machined while being penetrated by the laser beam. However, a problem is caused in that cracks are generated on the joining interface of the glass member and the silicon member.

SUMMARY OF THE INVENTION

An object of the present invention is to provide a method of cutting a laminate, an apparatus for manufacturing the laminate, a method of manufacturing the laminate and the laminate itself, the method being capable of cutting a laminate formed of a plurality of substrates of different types of laminated materials at low manufacturing cost with high quality.

According to the present invention, there is provided a method of cutting a laminate of the present invention comprising the steps of: forming a groove on one of the first and the second substrates; putting one substrate, on which the groove is formed, upon the other substrate so that the groove can be directed to the other substrate; and condensing and irradiating a laser beam onto the first and the second substrate from one substrate side, on which the groove is formed, along the groove, so that the laminate composed of the first and the second substrate can be cut.

According to another aspect of the present invention, there is provided a laminate in which a first plate member made of a semiconductor and a second plate member made of glass are put on each other, and the second plate member has a groove on the side which is directed to the first plate member.

According to still another aspect of the present invention, there is provided an apparatus for manufacturing a laminate having a mechanism for cutting a laminate formed of a first and a second substrate, wherein a groove is formed on one of the substrates, and the substrates are put upon each other so that the groove formed on one of the substrates can be directed to the other substrate. The apparatus for manufacturing a laminate comprises: a laser beam source; a laser beam condensing optical system; a table on which the laminate is put; and a moving mechanism for relatively moving the laser beam source and the table, wherein the laminate is put on the table so that the one substrate, on which the groove is formed, can be directed to the laser beam source, and the laminate is cut when the laser beam source is relatively moved with respect to the table and the laser beam is irradiated along the groove.

According to still another aspect of the present invention, there is provided a method of manufacturing a laminate of the present invention comprising: a step of forming a groove on one of the first and the second substrate; a step of laminating the first and the second substrate on each other so that the groove on one substrate can be directed to the other substrate; and a step of moving the laser beam source relative to the laminate while a laser beam is being irradiated to the laminate along the groove.

Due to the above-mentioned features, the laminate composed of the first and the second substrates, which are laminated on each other, can be positively cut by using a single laser beam.

The laminate formed of a plurality of substrates of different types of laminated materials can be cut at one time by irradiating a single laser beam. Accordingly, it is possible to effectively obtain an apparatus capable of cutting a laminate with high quality. Therefore, a dicing apparatus including a single laser can be made compact and the manufacturing cost can be reduced.

As the groove is formed on the joining face on which the glass member and the silicon member are joined to each other, the generation of cracks on the joining face, on which the glass member and the silicon member are joined to each other, can be suppressed.

BRIEF DESCRIPTION OF THE DRAWINGS

FIGS. 1(A) to 1(C) are diagrams showing a method of cutting a laminate according to the present invention;

DESCRIPTION OF THE PREFERRED EMBODIMENTS

Figure 2:
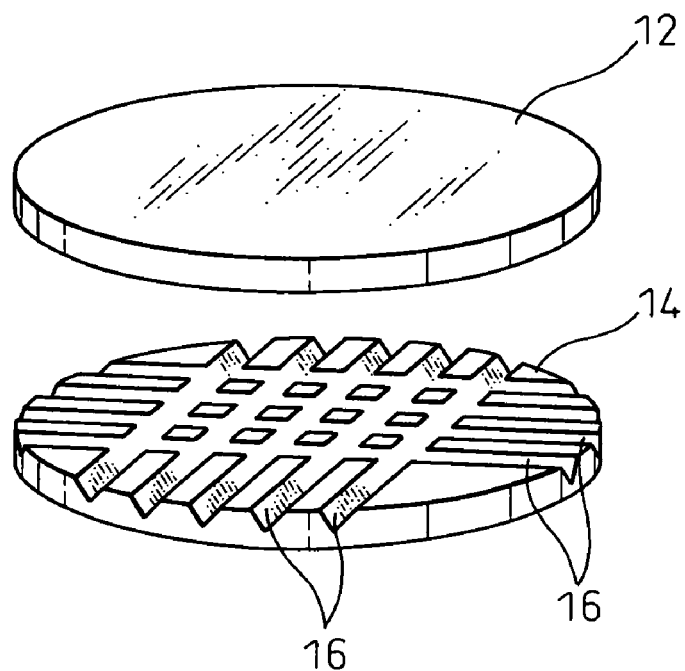
FIG. 2 is a perspective view showing a first substrate and a second substrate before being laminated together.

The preferred embodiments of the present invention are described below with reference to the drawings. FIGS. 1(A) to 1(C) are diagrams showing a method of cutting a laminate according to the present invention.

In FIG. 1(A), a laminate 10 comprising a first substrate 12 and a second substrate 14 is prepared. The second substrate 14 has a groove 16. An explanation is made below with reference to an example in which a plurality of MEMS devices are fabricated, but the present invention is not limited to this example. The laminate 10 has circuits and fine mechanisms formed therein corresponding to a plurality of MEMS devices, and is cut into individual MEMS devices separated from each other. The groove 16 is formed along a cutting line for separating the laminate into MEMS devices.

The first substrate 12 is formed of a semiconductor, i.e. constitutes a silicon wafer formed with circuits and fine mechanisms. The second substrate 14 is formed of pyrex glass, and the groove 16 is formed in the second substrate 14. The substrate 14 formed with the groove 16 is superposed on the first substrate 12 such that the groove 16 faces the first substrate 12.

In the embodiment, the first substrate 12 is formed of silicon and the second substrate 14 is formed of glass, but the first substrate 12 and the second substrate 14 are not limited to these materials, and other materials may be used. The first substrate 12 is formed of a material capable of absorbing the laser and the second substrate 14 is formed of a material which transmits the laser. The groove 16 is formed in the substrate made of a material which transmits the laser.

The first substrate 12 and the second substrate 14 are joined or bonded to each other. The first substrate 12 and the second substrate 14 are preferably bonded to each other by an anode junction.

In FIG. 1(B), a laser 18 is irradiated onto the first substrate 12 and the second substrate 14 along the groove 16 from the side of the second substrate 14 having the groove 16. The laser is first transmitted through the second substrate 14 and is irradiated onto the first substrate 12. The first substrate 12 absorbs the laser, and the surface portion 12A of the first substrate 12 is melted or evaporated. In this way, the first substrate 12 begins to be cut.

As shown in FIG. 1C, the silicon particles of the melted or evaporated portion 12A of the first substrate 12 are scattered and directed toward the inner surface of the groove 16 of the second substrate 14. As a result, the second substrate 14 is cut at the position of the groove 16. Also, the surface portion 12A of the first substrate 12 continues to be melted until the first substrate 12 is cut off. Thus, the laminate 10 including the first substrate 12 and the second substrate 14 is cut into separate individual MEMS devices.

FIG. 2 is a perspective view showing the first substrate 12 and the second substrate 14 before being laminated together. A plurality of grooves 16 are formed in parallel to each other in each of two orthogonal directions on the surface of the second substrate 14. The grooves 16 are formed along the cutting lines for separating the laminate 10 into individual MEMS devices. In this embodiment, the first substrate 12 is formed of a silicon wafer having a diameter of 4 inches and a thickness of 500 μm. The second substrate 14 is formed of an anode juncture glass having a diameter of 4 inches and a thickness of 400 μm. The depth of a groove 16 is 200 μm.

Figure 3:
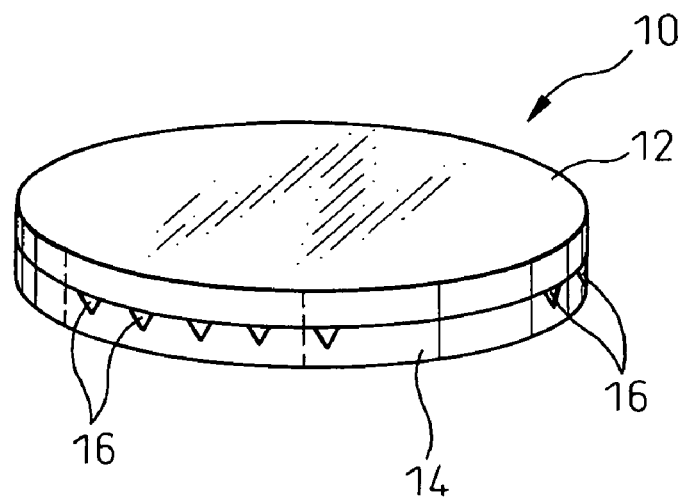
FIG. 3 is a perspective view showing a laminate comprising the first substrate and the second substrate.

FIG. 3 is a perspective view showing the laminate 10 including the first substrate 12 and the second substrate 14. The second substrate 14 is superposed on and joined to the first substrate 12 such that the grooves 16 face the first substrate 12. The grooves 16 are located in the joining surface between the first substrate 12 and the second substrate 14.

Figure 4:
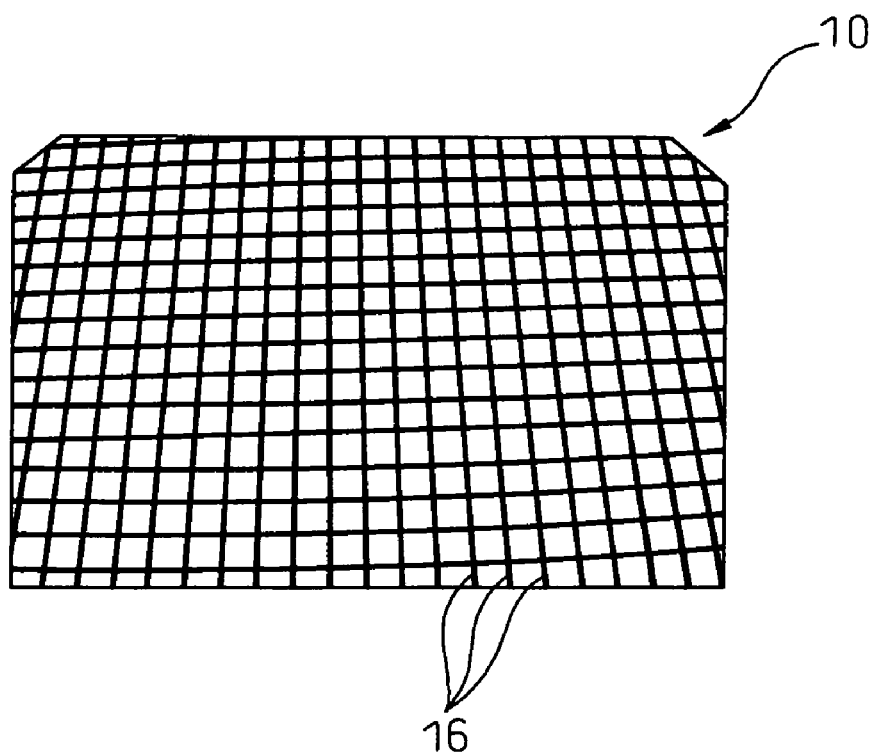
FIG. 4 is a top perspective view of a part of the laminate, as seen from the second substrate side.

FIG. 4 is a top perspective view of a part of the laminate 10, seen from the second substrate 14 side.

Figure 5:
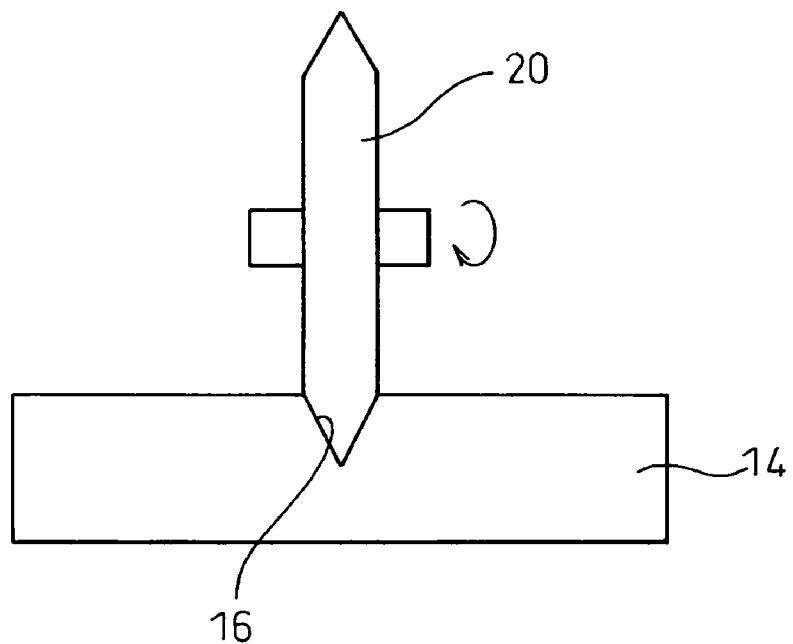
FIG. 5 is a diagram showing an example in which a groove is formed in the second substrate.

FIG. 5 is a diagram showing an example in which the groove 16 is formed in the second substrate 14. The groove 16 is formed in the surface of the second substrate 14 using a wheel 20 containing diamond abrasive grains. The wheel 20 is rotated in the direction as indicated by arrow, and moved relative to the second substrate 14 along the cutting line. The wheel 20 preferably has a peripheral cutting edge having a V-shaped cross section, so that the groove 16 is formed to have a V-shaped cross section.

Figure 6:
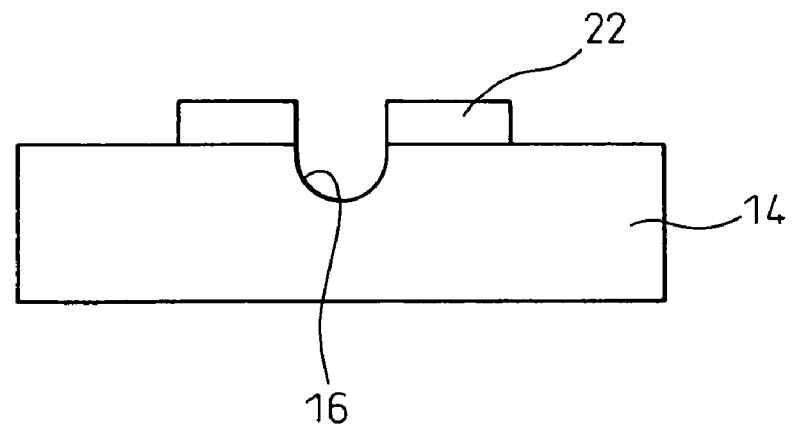
FIG. 6 is a diagram showing another example in which a groove is formed in the second substrate.

FIG. 6 is a diagram showing another example of forming a groove 16 in the second substrate 14. The groove 16 is formed in the surface of the second substrate 14 by etching with a mask 22. The groove 16 is preferably but not necessarily formed to have a V-shaped cross section. This is also the case with the example shown in FIG. 5.

Figure 7:
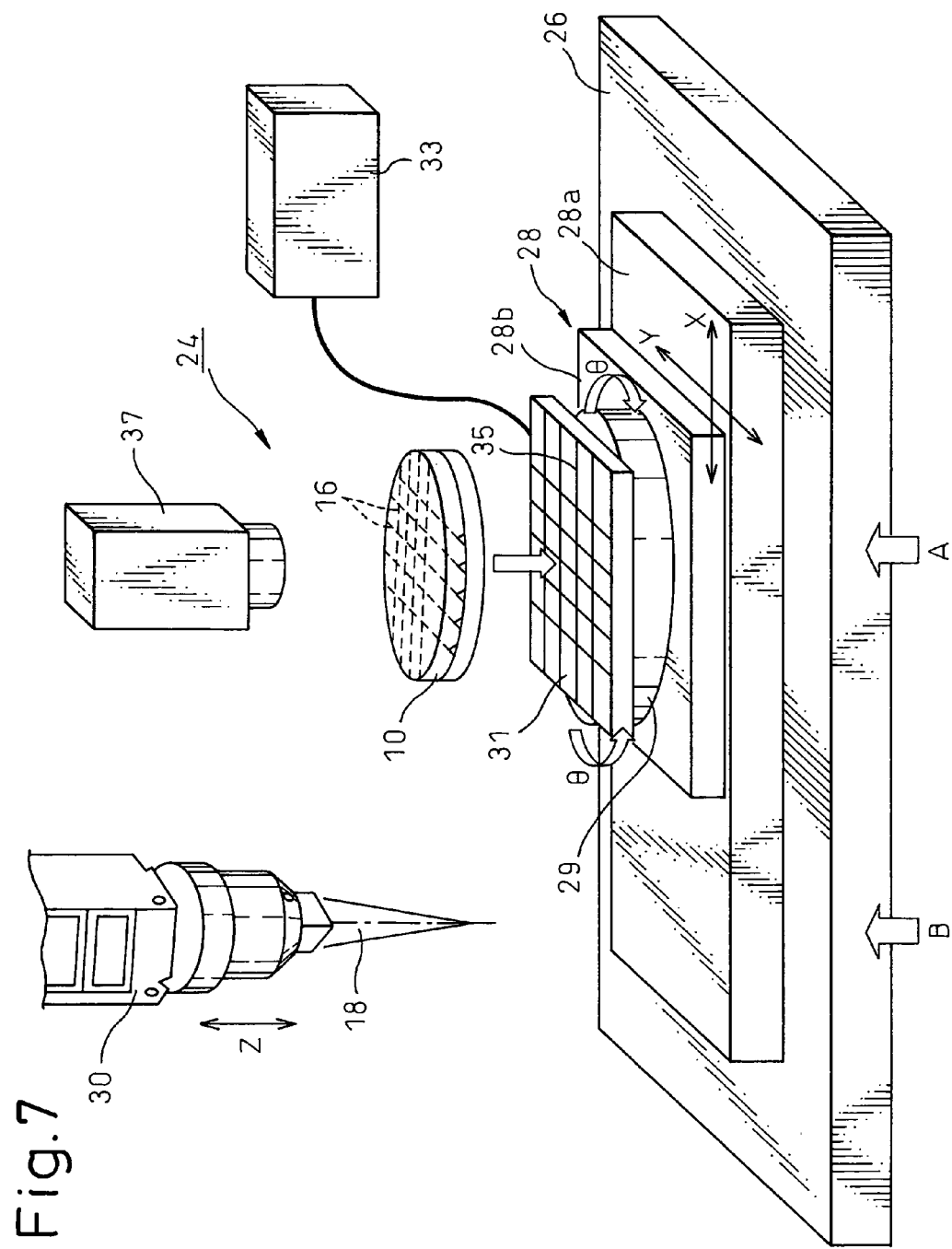
FIG. 7 is a perspective view showing a dicing apparatus for irradiating a laser onto the laminate.
Figure 8A:
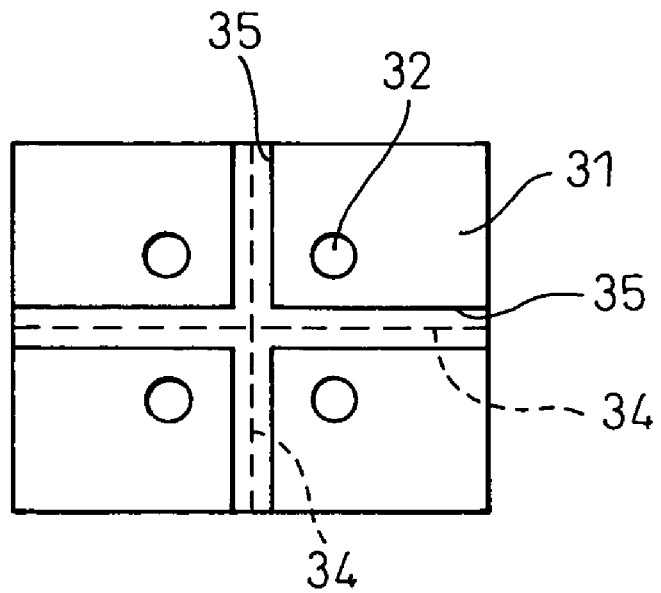
FIGS. 8(A) and 8(B) are a plan view and a sectional view showing a portion of the suction table shown in FIG. 7.
Figure 8B:
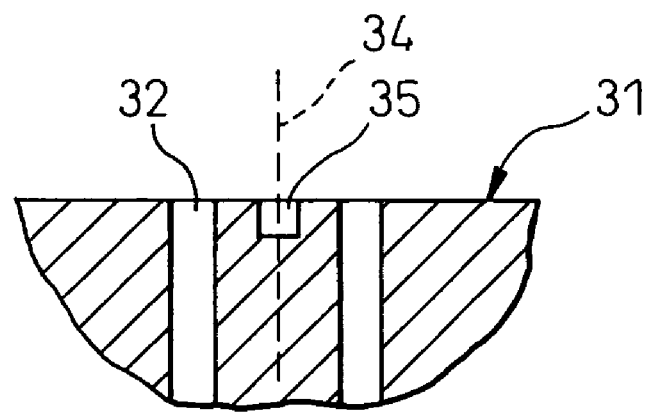

FIG. 7 is a perspective view showing a dicing apparatus for irradiating a laser beam to the laminate 16. FIG. 8(A) is a plan view showing a portion of the stage shown in FIG. 7, and FIG. 8(B) is a partially sectional view of the stage. The dicing apparatus 24 includes: a base 26; an XY stage 28 (Reference numeral 28a is an X stage, and reference numeral 28b is a Y stage.) arranged on the base 26; a rotary (θ) state 29; a suction table 31 arranged on the rotary state 29, for sucking and holding the laminate 10; a laser head 30 for irradiating a laser beam 18 toward the laminate 10 put on the suction table 31; a vacuum pump 33; and an infrared ray camera 37. As shown by the arrows in the drawing, the X stage 28a and the Y stage 28b can be respectively moved in the direction X and the direction Y which are perpendicular to each other. The rotary (θ) stage 29 can be rotated in the direction of arrow θ and restricts an inclined position of the suction table 31.

The suction table 31 has vacuum suction holes 32, and the laminate 10 is held on the suction table 31 by the action of vacuum introduced from the vacuum suction holes 32. The vacuum suction holes 32 are formed at positions shifted from the cutting lines 34 of the laminate 10. Therefore, even after the laminate 10 has been divided into the individual MEMS devices, the individual MEMS devices can be held on the suction table 31 by the action of vacuum introduced from the vacuum holes 32. The vacuum suction holes 32 on the suction table 31 are connected to the vacuum pump 33 by a well known means.

On the suction face of the suction table 31 for sucking and holding the laminate 10, the lattice-shaped release grooves 35 corresponding to the cutting lines 34 of the laminate 10 are formed, that is, the lattice-shaped release grooves 35 corresponding to the grooves 16 on the second substrate 14 of the laminate 10 are formed. When the laminate 10 is put on the suction table 31, while being monitored with the infrared ray camera 37 for alignment which is arranged in an upper portion of the suction table 31, the laminate 10 is aligned at a predetermined position on the suction table 31 so that the lattice-shaped grooves 6 on the laminate 10 can coincide with predetermined cutting lines and also can coincide with the release groove 35 on the suction table 31. Concerning the infrared ray camera 37, for example, a common camera, in which infrared rays, the wave-length of which is 2 μm, are used, can be used.

In the embodiment of the dicing apparatus shown in FIG. 7, the alignment position A of the laminated body 10 is different from the working position B which is an optical axis position at which the laser beam 18 is irradiated by the laser beam head 30. Of course, these positions A and B may be equal to each other.

Figure 9:
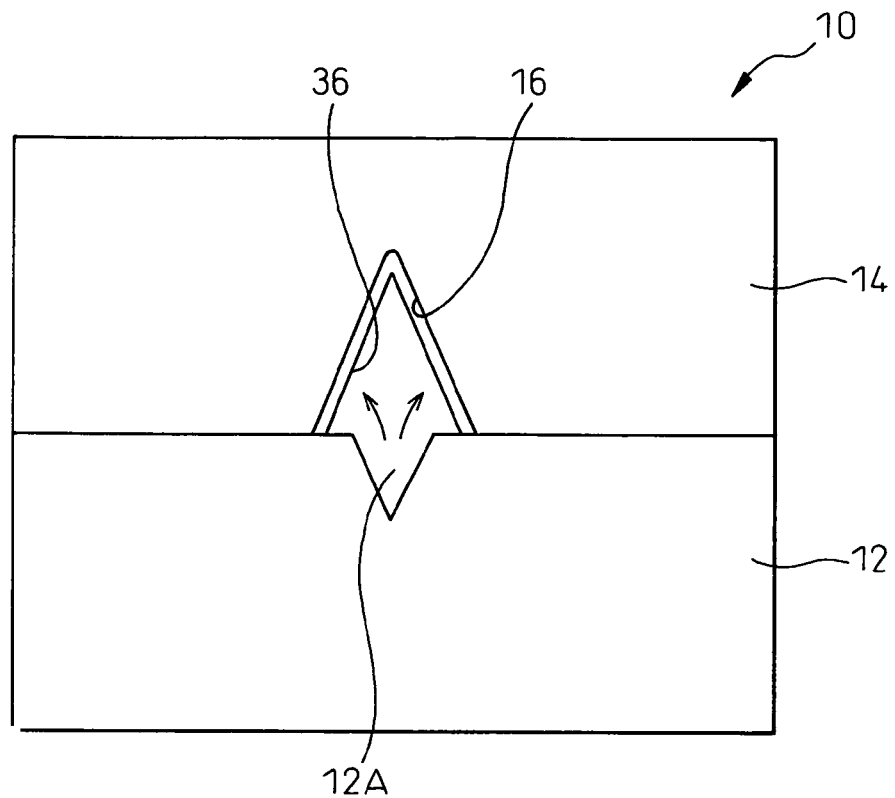
FIG. 9 is an enlarged sectional view showing the laminate upon the laser irradiation.

FIG. 9 is an enlarged sectional view showing a laminate at the time of irradiation of a laser beam. FIG. 9 is similar to FIG. 1(B). In FIG. 9, when the laser beam 18 is irradiated onto the first substrate 12 and the second substrate 14 from the second substrate 14 side, on which the groove 16 is formed, along the groove 16, first, the laser beam is transmitted through the second substrate 14 and irradiated onto the first substrate 12. The first substrate 12 absorbs the laser beam, and the surface portion 12A of the first substrate 12 is melted or vaporized. Cutting of the first substrate 12 is started in this way.

Silicon particles in the portion 12A of the first substrate 12, which has been melted and vaporized, are spouted or dispersed toward the inner face of the groove 16 of the second substrate 14 as illustrated by the arrows in the drawing. Therefore, the thus dispersed silicon particles are attached to the inner face of the groove 16 of the second substrate 14 and are formed into a film 36. Although the laser beam 18 is transmitted through the second substrate 14, the film 36, which has been attached to the inner face of the groove 16 of the second substrate 14, absorbs the laser beam. Therefore, the temperature of the film 36 is raised, and the temperature of the inner face of the groove 16 of the second substrate 14 coming into contact with the film 36 is raised, and stress is given to the inner face of the groove 16. As a result, the second substrate 14 is cut at the position of the groove 16. The surface portion 12A of the first substrate 12 is successively melted and vaporized. Finally, the first substrate 12 is completely cut off. In this way, the laminate 10, which is composed of the first substrate 12 and the second substrate 14, is cut off, and the individual MEMS devices are divided from each other. In this connection, in order to simplify the explanations, it is illustrated in the drawing that the film thickness is uniform. However, it is unnecessary that the thickness of the film 36 is uniform or that the film 36 is continuously formed.

In this connection, as the groove 16 is provided on the second substrate 14, silicon particles of the portion 12A on the first substrate 12, which is melted and vaporized, can be dispersed toward the inner face of the groove 16 of the second substrate 14. In the case where no groove 16 is provided, it is impossible for the silicon particles, which are spouting out, to be released. Therefore, a high stress is generated on the joining face on which the silicon member and the glass member are joined to each other. Accordingly, there is a possibility that undesirable defects such as interface separation or microcracks in the material are caused. When the groove 16 is provided, the occurrence of the above defects can be avoided.

Figure 10:
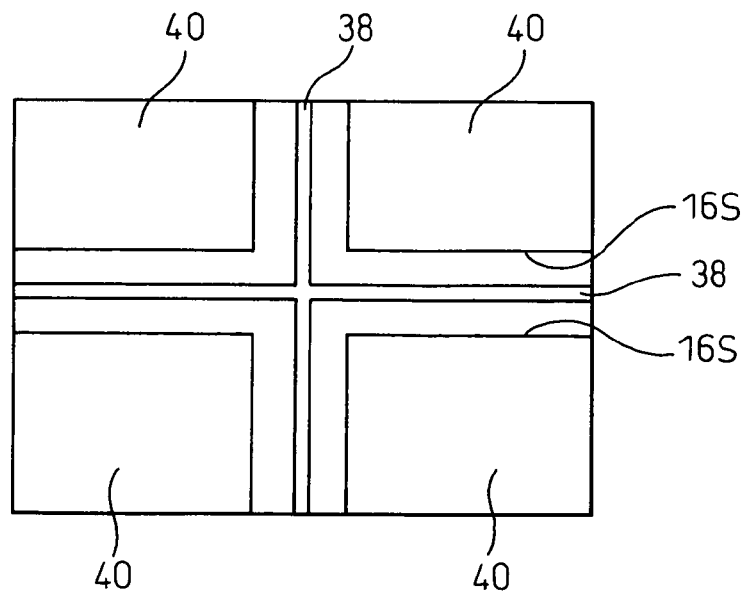
FIG. 10 is a plan view showing a part of the laminate cut by the laser irradiation.

FIG. 10 is a plan view showing a portion of the laminate 10 which has been cut by means of laser beam irradiation. In FIG. 10, reference numeral 16S is a side edge of the opening portion of the groove 16. Reference numeral 38 is a cutting portion made by means of laser beam irradiation. The laminate 10 is divided into the individual MEMS devices (chips) 40 at the cutting portion 38.

As described above, the portion 12A on the surface of the first substrate 12 continues to be melted and vaporized by means of laser beam irradiation, and finally the first substrate 12 is perfectly cut off. At this time, the melted and vaporized silicon particles reach a lower face of the first substrate 12, that is, an upper face of the suction table 31. However, in this embodiment, as described before, the lattice-shaped release grooves 35 are formed on the upper face of the suction table 31 along the cutting lines 34 of the laminate 10. Therefore, even if the melted and vaporized silicon particles reach the upper face of the suction table 31, these particles are absorbed by the release grooves 35. Therefore, the suction table 31 itself is not affected by these particles.

In this embodiment, concerning the laser beam 18, the pulse YAG laser beam (the laser beam wave-length λ=1064 nm) was used, and the laser beam 18 is irradiated from the second substrate 14 side of the laminate 10 which was put on the suction table 31. The laser beam 18 was irradiated under the following working condition. The pulse width of the laser beam 18 is 0.1 ms, the pulse repetition is 300 times/sec, the pulse energy is 40 mJ/pulse, and the feed speed of the stage XY 28 is 120 mm/min. In this case, the laser beam 18 was adjusted so that the laser beam 18 could be condensed in the neighborhood of the joining face of the first substrate 12 and the second substrate 14. As a result, as shown in FIG. 10, both the first substrate 12 and the second substrate 14 were excellently cut, that is, the laminate 10 was positively cut. The laminate 10 was cut at high speed in such a manner that the feed speed of the stage XY 28 was 120 mm/min.

It should be understood, by those skilled in the art, that the foregoing description relates to only a preferred embodiment of the disclosed invention, and that various changes and modifications may be made to the invention without departing the sprit and scope thereof.

INDUSTRIAL APPLICABILITY

As explained above, according to the present invention, when a laser beam (for example, YAG laser beam) capable of machining one material among a plurality of materials is used, a laminate including two or more materials can be easily cut. Therefore, the dicing apparatus can be simplified and the manufacturing cost can be reduced. When a groove is provided on the material joining face along the cutting line, the material joining face can be prevented from being separated and the device can be prevented from being damaged.

The invention claimed is:

1. A method of manufacturing a laminate comprising first and second substrates made of respective materials, the corresponding transmittance and absorptance properties of which, with respect to a laser beam, are different from each other, the method comprising:
    forming a groove in a first surface of the second substrate;
    putting the second substrate, in which the groove is formed, on the first substrate so that the groove is directed toward the first substrate; and
    irradiating a laser beam onto the first and the second substrates from a second surface of the second substrate, opposite to the first surface thereof on which the groove is formed, along the groove, to cut the laminate,
    wherein the first substrate is cut by the laser beam, as transmitted through the second substrate, particles of the first substrate are melted and vaporized by the laser beam and attach to an inner face of the groove of the second substrate, forming a film on the inner face, and the film is irradiated by the laser beam passing through the second substrate and along the groove, to stress the second substrate and thereby cut the laminate.

2. A method according to claim 1, wherein the laser beam is transmitted through the second substrate and absorbed by the first substrate.

3. A method according to claim 2, wherein the groove is formed in the first surface of the second substrate through which the laser beam is transmitted and the laser beam is irradiated from the first surface of the second substrate onto the first substrate.

4. A method according to claim 1, wherein the first substrate comprises a semiconductor and the second substrate comprises glass, and the groove is formed in the second substrate.

5. A method according to claim 1, wherein the first and the second substrates are joined to each other.

6. A method of manufacturing a laminate comprising first and second substrates made of respective first and second different materials having corresponding, different transmittance and absorptance properties with respect to irradiation of same by a laser beam, the method comprising:
    forming a groove in a first surface of the second substrate;
    putting the second substrate, in which the groove is formed, on the first substrate so that the groove is directed toward the first substrate; and
    irradiating a laser beam onto the first and the second substrates from a second surface of the second substrate, opposite to the first surface thereof on which groove is formed, along the groove, thereby to cut the laminate,
    wherein the first substrate is cut by the laser beam, as transmitted through the second substrate, particles of the first substrate are melted and vaporized by the laser beam and attach to an inner face of the groove of the second substrate, forming a film on the inner face, and the film is irradiated by the laser beam passing through the second substrate and along the groove, to stress the second substrate and thereby cut the laminate.

7. A method according to claim 6, wherein the laser beam is transmitted through the second substrate and absorbed by the first substrate.

8. A method according to claim 2, wherein the groove is formed in the first surface of the second substrate, through which the laser beam is transmitted, and the laser beam is radiated from the first surface of the second substrate onto the first substrate.

9. A method according to claim 6, wherein the first substrate comprises a semiconductor and the second substrate comprises glass.

10. A method according to claim 6, wherein the first and second substrates are joined to each other along respective facing surfaces thereof.

* * * * *